United States Patent [19]

Tang et al.

[11] Patent Number: 4,885,211

[45] Date of Patent: * Dec. 5, 1989

[54] ELECTROLUMINESCENT DEVICE WITH IMPROVED CATHODE

[75] Inventors: Ching W. Tang; Steven A. VanSlyke, both of Rochester, N.Y.

[73] Assignee: Eastman Kodak Company, Rochester, N.Y.

[*] Notice: The portion of the term of this patent subsequent to Jan. 19, 2005 has been disclaimed.

[21] Appl. No.: 13,530

[22] Filed: Feb. 11, 1987

[51] Int. Cl.$^4$ .................. B32B 15/04; H01J 1/62; H01L 29/12; C09K 11/06

[52] U.S. Cl. ................. 428/457; 252/301.16; 313/346 R; 313/498; 313/504; 313/506; 313/507; 357/8; 428/411.1; 428/461; 428/515; 428/917

[58] Field of Search ............... 313/346 R, 346 C, 498, 313/504, 506, 507; 252/301.16; 357/8; 428/411.1, 457, 461, 515, 917

[56] References Cited

U.S. PATENT DOCUMENTS

| | | | |
|---|---|---|---|
| 3,172,862 | 3/1965 | Gurnee et al. | 252/301.2 |
| 3,173,050 | 3/1965 | Gurnee | 313/108 |
| 3,359,445 | 12/1967 | Roth | 313/108 |
| 3,382,394 | 5/1968 | Mehl | 313/108 |
| 3,530,325 | 9/1970 | Mehl et al. | 313/108 |
| 3,621,321 | 11/1971 | Williams et al. | 313/108 |
| 3,710,167 | 1/1973 | Dresner et al. | 313/108 |
| 3,772,556 | 11/1973 | Williams | 313/108 |
| 3,932,314 | 1/1976 | Kawabe et al. | 313/346 DC |
| 3,995,299 | 11/1976 | Partridge | 357/8 |
| 4,097,762 | 6/1978 | Hilton et al. | 313/346 R |
| 4,165,473 | 8/1979 | Falce | 313/346 R |
| 4,356,429 | 10/1982 | Tang | 252/301.2 |
| 4,369,392 | 1/1983 | Hotta et al. | 313/346 R |
| 4,539,507 | 9/1985 | Van Slyke et al. | 252/301.2 |
| 4,671,777 | 6/1987 | van Esdonk et al. | 313/346 DC |
| 4,672,268 | 6/1987 | Duenisch et al. | 313/346 R |
| 4,675,570 | 6/1987 | Green | 313/346 DC |

OTHER PUBLICATIONS

Kawabe et al, "Electroluminescence of Green Light Region in Doped Anthracene", *Japan Journal of Applied Physics*, vol. 10, pp. 527-528, 1971.

Dresner, "Double Injection Electroluminescence in Anthracene", *RCA Review*, vol. 30, 1969, pp. 322-334.

*Primary Examiner*—George F. Lesmes
*Assistant Examiner*—James B. Monroe
*Attorney, Agent, or Firm*—Carl O. Thomas

[57] ABSTRACT

An electroluminescent device is disclosed comprised of, in sequence, an anode, an organic hole transporting zone, an organic electron transporting zone, and a cathode. The cathode is comprised of a layer of a plurality of metals other than alkali metals, at least one of said metals having a work function of less than 4 eV.

23 Claims, 2 Drawing Sheets

10 μm

10 μm

ELECTROLUMINESCENT DEVICE WITH IMPROVED CATHODE

FIELD OF THE INVENTION

This invention relates to organic electroluminescent devices. More specifically, this invention relates to devices which emit light from an organic layer positioned between anode and cathode electrodes when a voltage is applied across the electrodes.

BACKGROUND OF THE INVENTION

While organic electroluminescent devices have been known for about two decades, their performance limitations have represented a barrier to many desirable applications.

Gurnee et al U.S. Pat. No. 3,172,862, issued Mar. 9, 1965, filed Sept. 29, 1960, disclosed an organic electroluminescent device. (For brevity EL, the common acronym for electroluminescent, is sometimes substituted.) The EL device was formed of an emitting layer positioned in conductive contact with a transparent electrode and a metal electrode. The emitting layer was formed of a conjugated organic host material, a conjugated organic activating agent having condensed benzene rings, and a finely divided conductive material. Naphthalene, anthracene, phenanthrene, pyrene, benzopyrene, chrysene, picene, carbazole, fluorene, biphenyl, terphenyls, quaterphenyls, triphenylene oxide, dihalobiphenyl, trans-stilbene, and 1,4-diphenylbutadiene were offered as examples of organic host materials. Anthracene, tetracene, and pentacene were named as examples of activating agents, with anthracene being disclosed to impart a green hue and pentacene to impart a red hue. Chrome and brass were disclosed as examples of the metal electrode while the transparent electrode was disclosed to be a conductive glass. The phosphor layer was disclosed to be "as thin as possible, about 0.0001 inch"—i.e., 2.54 micrometers. Electroluminescence was reported at 800 volts and 2000 hertz.

Recognizing the disadvantage of employing high voltages and frequencies Gurnee U.S. Pat. No. 3,173,050 reported electroluminescence at 110 volts d.c. by employing in series with the emitting layer an impedance layer capable of accounting for 5 to 50 percent of the voltage drop across the electrodes.

Until relatively recently the art has reported at best modest performance improvements over Gurnee while resorting to increasingly challenging device constructions, such as those requiring alkali metal cathodes, inert atmospheres, relatively thick monocrystalline anthracene phosphor elements, and/or specialized device geometries. Mehl U.S. Pat. No. 3,382,394, Mehl et al U.S. Pat. No. 3,530,325, Roth U.S. Pat. No. 3,359,445, Williams et al U.S. Pat. No. 3,621,321, Williams U.S. Pat. No. 3,772,556, Kawabe et al "Electroluminescence of Green Light Region in Doped Anthracene", *Japan Journal of Applied Physics*, Vol. 10, pp. 527–528, 1971, and Partridge U.S. Pat. No. 3,995,299 are representative.

In 1969 Dresner, "Double Injection Electroluminescence in Anthracene", *RCA Review*, Vol. 30, pp. 322–334, independently corroborated the performance levels of state of the art EL devices employing thick anthracene phosphor elements, alkali metal cathodes, and inert atmospheres to protect the alkali metal from spontaneous oxidation. These EL devices were more than 30 $\mu$m in thickness and required operating potentials of more than 300 volts. In attempting to reduce phosphor layer thickness and thereby achieve operation with potential levels below 50 volts Dresner attempted to coat anthracene powder between a conductive glass anode and a gold, platinum or tellurium grid cathode, but phosphor layer thicknesses of less than 10 $\mu$m could not be successfully achieved because of pinholes.

Dresner U.S. Pat. No. 3,710,167 reported a more promising EL device employing like Gurnee et al and Gurnee a conjugated organic compound, but as the sole component of an emitting layer of less than 10 $\mu$m (preferably 1 to 5 $\mu$m) in thickness. A tunnel injection cathode consisting of aluminum or degenerate N$^+$ silicon with a layer of the corresponding aluminum or silicon oxide of less 10 Angstroms in thickness was employed.

The most recent discoveries in the art of organic EL device construction have resulted from EL device constructions with two extremely thin layers (<1.0 $\mu$m in combined thickness) separating the anode and cathode, one specifically chosen to transport holes and the other specifically chosen to transport electrons and acting as the organic luminescent zone of the device. This has allowed applied voltages to be reduced for the first time into ranges approaching compatibility with integrated circuit drivers, such as field effect transistors. At the same time light outputs at these low driving voltages have been sufficient to permit observation under common ambient lighting conditions.

For example, Tang U.S. Pat. No. 4,356,429 discloses in Example 1 an EL device formed of a conductive glass transparent anode, a 1000 Angstroms hole transporting layer of copper phthalocyanine, a 1000 Angstroms electron transporting layer of tetraphenylbutadiene in poly(styrene) also acting as the luminescent zone of the device, and a silver cathode. The EL device emitted blue light when biased at 20 volts at an average current density in the 30 to 40 mA/cm$^2$ range. The brightness of the device was 5 cd/m$^2$. Tang teaches useful cathodes to be those formed from common metals with a low work function, such as indium, silver, tin, and aluminum.

A further improvement in organic layer EL devices is taught by Van Slyke et al U.S. Pat. No. 4,539,507. Referring to Example 1, onto a transparent conductive glass anode were vacuum vapor deposited successive 750 Angstrom hole transporting 1,1-bis(4-di-p-tolylaminophenyl)cyclohexane and electron transporting 4,4'-bis(5,7-di-t-pentyl-2-benzoxazolyl)stilbene layers, the latter also providing the luminescent zone of the device. Indium was employed as the cathode. The EL device emitted blue-green light (520 nm peak). The maximum brightness achieved 340 cd/m$^2$ at a current density of about 140 mA/cm$^2$ when the applied voltage was 22 volts. The maximum power conversion efficiency was about $1.4 \times 10^{-3}$ watt/watt, and the maximum EL quantum efficiency was about $1.2 \times 10^{-2}$ photon/electron when driven at 20 volts. Silver, tin, lead, magnesium, manganese, and aluminum are specifically mentioned for cathode construction.

Van Slyke et al U.S. Ser. No. 13,528, concurrently filed and commonly assigned, titled ELECTROLUMINESCENT DEVICE WITH ORGANIC LUMINESCENT MEDIUM, now U.S. Pat. No. 4,720,432 discloses an organic EL device comprised of, in the sequence recited, an anode, an organic hole injecting and transporting zone, an organic electron injecting and transporting zone, and a cathode. The organic EL device is further characterized in that the organic hole injecting and transporting zone is comprised of a layer in contact with the anode containing a hole injecting porphyrinic compound and a layer containing a hole transporting aromatic tertiary amine interposed between the hole injecting layer and the electron injecting and transporting zone.

SUMMARY OF THE INVENTION

Although recent performance improvements in organic EL devices have suggested a potential for widespread use, most practical applications require limited voltage input or light output variance over an extended period of time. The stability of the device cathode has been a source of concern. Cathode degradation results in obtaining progressively lower current densities when a constant voltage is applied. Lower current densities in turn result in lower levels of light output. With a constant applied voltage practical EL device use terminates when light emission levels drop below acceptable levels—e.g., readily visually detectable emission levels in ambient lighting. If the applied voltage is progressively increased to hold light emission levels constant, the field across the EL device is correspondingly increased. Eventually a voltage level is required that cannot be conveniently supplied by the EL device driving circuitry or which produces a field gradient (volts/cm) exceeding the dielectric breakdown strength of the layers separating the electrodes, resulting in a catastrophic failure of the EL device.

In choosing a cathode material it has been recognized that the lowest work function metals most readily release electrons for injection into the electron transporting layer providing the organic luminescent zone of the device. The lowest work function metals are alkali metals. Their instability in air renders alkali metals difficult to use in EL device manufacture and unattractive for use in simple device constructions requiring practical shelf and operating lifetimes.

With alkali metals being rejected, the art has chosen to employ other low work function metals, such as magnesium, or to forego the electron injection advantages of lower work function metals in favor of greater cathode stability provided by somewhat higher work function metals, such as silver.

Another difficulty that has arisen in the construction of organic EL devices is that it has not been possible prior to this invention to achieve efficient light emission through a cathode formed of a low work function metal. Using a low work function metal such as magnesium as an example, attempts to form the metal layer thin enough to permit efficient light transmission has resulted in unacceptably high sheet resistance. On the other hand, when the cathode metal is coated thick enough to be acceptably conductive, less than half the light received is transmitted.

In one aspect this invention is directed to an electroluminescent device comprising in sequence, an anode, an organic hole transporting zone, an organic electron transporting zone, and a cathode, characterized in that the cathode is comprised of a layer consisting essentially of a plurality of metals other than alkali metals, at least one of the metals having a work function of less than 4 eV.

It has been discovered quite unexpectedly that the foregoing combination of a low work function metal and at least one other metal in the cathode of an organic EL device results in improving the stability of the cathode and therefore the stability of the device as a whole. It has been observed that the initial performance advantages of low work function metals other than alkali metals as cathode materials are only slightly diminished when combined with more stable, higher work function metals while marked extensions of EL device lifetimes are realized with even small amounts of a second metal being present. Further, the advantages in extended lifetimes can be realized even when the cathode metals are each low work function metals other than alkali metals. Additionally, the use of combinations of metals in forming the cathodes of the organic EL devices of this invention has resulted in unexpected advantages in fabrication, such as improved acceptance by the electron transporting organic layer during vacuum vapor deposition of the cathode.

Another unexpected advantage realized with the cathode metal combinations of this invention is that low work function metals can be employed to prepare cathodes which are light transmissive and at the same time exhibit low levels of sheet resistance. Thus, the option is afforded of organic EL device constructions in which the anode need not perform the function of light transmission, thereby affording new use opportunities for organic EL devices.

BRIEF DESCRIPTION OF THE DRAWINGS

These and other advantages of the present invention can be better appreciated by reference to the following detailed description considered in conjuction with the drawings, in which.

The drawings are necessarily of a schematic nature, since the thicknesses of the individual layers are too thin and thickness differences of the various device elements too great to permit depiction to scale or to permit proportionate scaling.

DESCRIPTION OF PREFERRED EMBODIMENTS

Figure 1:
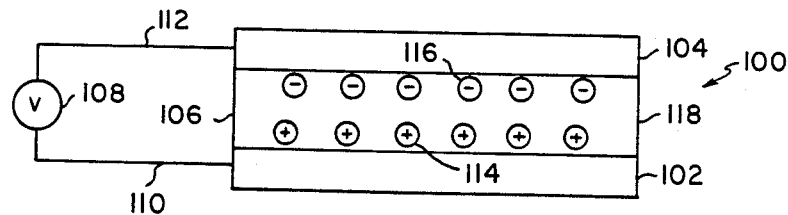
FIGS. 1, 2, and 3 are schematic diagrams of EL devices.

An electroluminescent or EL device 100 according to the invention is schematically illustrated in FIG. 1. Anode 102 is separated from cathode 104 by an organic luminescent medium 106. The anode and the cathode are connected to an external power source 108 by conductors 110 and 112, respectively. The power source can be a continuous direct current or alternating current voltage source or an intermittent current voltage source. Any convenient conventional power source, including any desired switching circuitry, can be employed which is capable of positively biasing the anode with respect to the cathode. Either the anode or cathode can be at ground potential.

The EL device can be viewed as a diode which is forward biased when the anode is at a higher potential than the cathode. Under these conditions the anode injects holes (positive charge carriers), schematically shown at 114, into the luminescent medium while the cathode injects electrons, schematically shown at 116, into the luminescent medium. The portion of the luminescent medium adjacent the anode thus forms a hole transporting zone while the portion of the luminescent medium adjacent the cathode forms an electron transporting zone. The injected holes and electrons each migrate toward the oppositely charged electrode. This results in hole-electron recombination within the organic luminescent medium. When a migrating electron drops from its conduction potential to a valence band in filling a hole, energy is released as light. Hence the organic luminescent medium forms between the electrodes a luminescence zone receiving mobile charge carriers from each electrode. Depending upon the choice of alternative constructions, the released light can be emitted from the luminescent material through one or more of edges 118 separating the electrodes, through the anode, through the cathode, or through any combination of the foregoing.

Reverse biasing of the electrodes disrupts charge injection, depletes the luminescent medium of mobile charge carriers, and terminates light emission. The most common mode of operating organic EL devices is to employ a forward biasing d.c. power source and to rely on external current interruption or modulation to regulate light emission.

In the organic EL devices of the invention it is possible to maintain a current density compatible with efficient light emission while employing a relatively low voltage across the electrodes by limiting the total thickness of the organic luminescent medium to less than 1 $\mu$m (10,000 Angstroms). At a thickness of less than 1 $\mu$m an applied voltage of 20 volts results in a field potential of greater than $2 \times 10^5$ volts/cm, which is compatible with efficient light emission. As more specifically noted below, an order of magnitude reduction (to 0.1 $\mu$m or 1000 Angstroms) in thickness of the organic luminescent medium, allowing further reductions in applied voltage and/or increase in the field potential, are well within device construction capabilities.

Since the organic luminescent medium is quite thin, it is usually preferred to emit light through one of the two electrodes. This is achieved by forming the electrode as a translucent or transparent coating, either on the organic luminescent medium or on a separate translucent or transparent support. The thickness of the coating is determined by balancing light transmission (or extinction) and electrical conductance (or resistance). A practical balance in forming a light transmissive metallic electrode is typically for the conductive coating to be in the thickness range of from about 50 to 250 Angstroms. Where the electrode is not intended to transmit light, any greater thickness found convenient in fabrication can also be employed.

Figure 2:
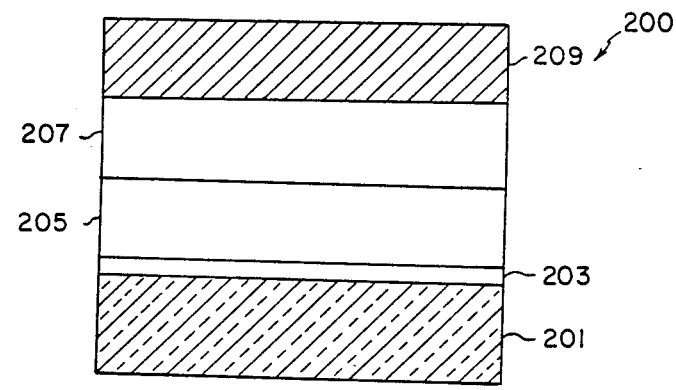

Organic EL device 200 shown in FIG. 2 is illustrative of one preferred embodiment of the invention. Because of the historical development of organic EL devices it is customary to employ a transparent anode. This has been achieved by providing a transparent insulative support 201 onto which is deposited a conductive relatively high work function metal or metal oxide transparent layer to form anode 203. Since the portion of the organic luminescent medium immediately adjacent the anode acts as a hole transporting zone, the organic luminescent medium is preferably formed by depositing on the anode a layer 205 of an organic material chosen for its hole transporting efficiency. In the orientation of the device 200 shown, the portion of the organic luminescent medium adjacent its upper surface constitutes an electron transporting zone and is formed of a layer 207 of an organic material chosen for its electron transporting efficiency. With preferred choices of materials, described below, forming the layers 205 and 207, the latter also forms the zone in which luminescence occurs. The cathode 209 is conveniently formed by deposition on the upper layer of the organic luminescent medium.

Figure 3:
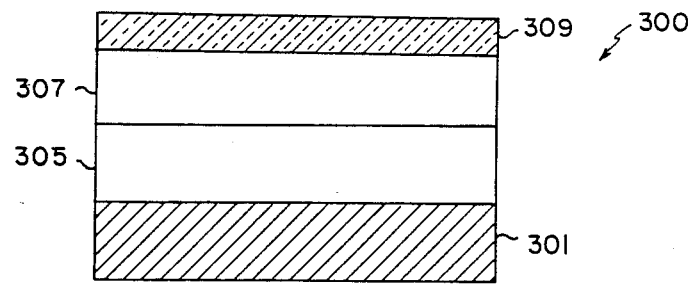

Organic EL device 300 shown in FIG. 3 is illustrative of another preferred embodiment of the invention. Contrary to the historical pattern of organic EL device development, light emission from the device 300 is through the light transmissive (e.g., transparent or substantially transparent) cathode 309. While the anode of the device 300 can be formed identically as the device 200, thereby permitting light emission through both anode and cathode, in the preferred form shown the device 300 employs an opaque charge conducting element to form the anode 301, such as a relatively high work function metallic substrate. The hole and electron transporting layers 305 and 307 can be identical to the corresponding layers 205 and 207 of the device 200 and require no further description. The significant difference between devices 200 and 300 is that the latter employs a thin, light transmissive (e.g., transparent or substantially transparent) cathode in place of the opaque cathode customarily included in organic EL devices.

Viewing organic EL devices 200 and 300 together, it is apparent that the present invention offers the option of mounting the devices on either a positive or negative polarity opaque substrate.

Unexpected fabrication, performance, and stability advantages have been realized by forming the cathode of a combination of a low work function metal and at least one other metal. A low work function metal is herein defined as a metal having a work function of less than 4 eV. Generally the lower the work function of the metal, the lower the voltage required for electron injection into the organic luminescent medium. However, alkali metals, the lowest work function metals, are too reactive to achieve stable EL device performance with simple device constructions and construction procedures and are excluded (apart from impurity concentrations) from the cathodes of this invention.

Available low work function metal choices for the cathode (other than alkali metals) are listed below by periods of the Periodic Table of Elements and categorized into 0.5 eV work function groups. All work function provided are taken Sze, *Physics of Semiconductor Devices*, Wiley, N.Y., 1969, p. 366. (including the rare earth metals—i.e. yttrium and the lanthanides, but excluding boron and aluminum), and the actinide groups of metals. The alkaline earth metals, owing to their ready availability, low cost, ease of handling, and minimal adverse environmental impact potential, constitute a preferred class of low work function metals for use in the cathodes of EL devices of this invention. Magnesium and calcium are particularly preferred. Though significantly more expensive, the included Group III metals, particularly the rare earth metals, possess similar advantages and are specifically contemplated as preferred low work function metals. The low work function metals exhibiting work functions in the range of from 3.0 to 4.0 eV are generally more stable than metals exhibiting lower work functions and are therefore generally preferred.

A second metal included in the construction of the cathode has as one primary purpose to increase the stability (both storage and operational) of the cathode. It can be chosen from among any metal other than an alkali metal. The second metal can itself be a low work function metal and thus be chosen from the metals listed above having a work function of less than 4 eV, with the same preferences above discussed being fully applicable. To the extent that the second metal exhibits a low work function it can, of course, supplement the first metal in facilitating electron injection.

Alternatively, the second metal can be chosen from any of the various metals having a work function greater than 4 eV, which includes the elements more resistant to oxidation and therefore more commonly fabricated as metallic elements. To the extent the second metal remains invariant in the organic EL device as fabricated, it contributes to the stability of the device.

| Period | Element | Work Function By eV Group |
|---|---|---|
| 2 | Beryllium | 3.5–4.0 |
| 3 | Magnesium | 3.5–4.0 |
| 4 | Calcium | 2.5–3.0 |
|  | Scandium | 3.0–3.5 |
|  | Titanium | 3.5–4.0 |
|  | Manganese | 3.5–4.0 |
|  | Gallium | 3.5–4.0 |
| 5 | Strontium | 2.0–2.5 |
|  | Yttrium | 3.0–3.5 |
|  | Indium | 3.5–4.0 |
| 6 | Barium | ~2.5 |
|  | Lanthanum | 3.0–3.5 |
|  | Cerium | 2.5–3.0 |
|  | Praseodymium | 2.5–3.0 |
|  | Neodymium | 3.0–3.5 |
|  | Promethium | 3.0–3.5 |
|  | Samarium | 3.0–3.5 |
|  | Europium | 2.5–3.0 |
|  | Gadolinium | 3.0–3.5 |
|  | Terbium | 3.0–3.5 |
|  | Dysprosium | 3.0–3.5 |
|  | Holmium | 3.0–3.5 |
|  | Erbium | 3.0–3.5 |
|  | Thulium | 3.0–3.5 |
|  | Ytterbium | 2.5–3.0 |
|  | Lutetium | 3.0–3.5 |
|  | Hafnium | ~3.5 |
| 7 | Radium | 3.0–3.5 |
|  | Actinium | 2.5–3.0 |
|  | Thorium | 3.0–3.5 |
|  | Uranium | 3.0–3.5 |

From the foregoing listing it is apparent that the available low work function metals for the most part belong to the Group IIa or alkaline earth group of metals, the Group III group of metals Available higher work function (4 eV or greater) metal choices for the cathode are listed below by periods of the Periodic Table of Elements and categorized into 0.5 eV work function groups.

| Period | Element | Work Function By eV Group |
|---|---|---|
| 2 | Boron | 4.5 |
|  | Carbon | 4.5–5.0 |
| 3 | Aluminum | 4.0–4.5 |
| 4 | Vanadium | 4.0–4.5 |
|  | Chromium | 4.5–5.0 |
|  | Iron | 4.0–4.5 |
|  | Cobalt | 4.0–4.5 |
|  | Nickel | ~4.5 |
|  | Copper | 4.0–4.5 |
|  | Zinc | 4.0–4.5 |
|  | Germanium | 4.5–5.0 |
|  | Arsenic | 5.0–5.5 |
|  | Selenium | 4.5–5.0 |
| 5 | Molybdenum | 4.0–4.5 |
|  | Technetium | 4.0–4.5 |
|  | Ruthenium | 4.5–5.0 |
|  | Rhodium | 4.5–5.0 |
|  | Palladium | 4.5–5.0 |

-continued

| Period | Element | Work Function By eV Group |
|---|---|---|
|  | Silver | 4.0–4.5 |
|  | Cadmium | 4.0–4.5 |
|  | Tin | 4.0–4.5 |
|  | Antimony | 4.0–4.5 |
|  | Tellurium | 4.5–5.0 |
| 6 | Tantalum | 4.0–4.5 |
|  | Tungsten | ~4.5 |
|  | Rhenium | ~5.0 |
|  | Osmium | 4.5–5.0 |
|  | Iridium | 5.5–6.0 |
|  | Platinum | 5.5–6.0 |
|  | Gold | 4.5–5.0 |
|  | Mercury | ~4.5 |
|  | Lead | ~4.0 |
|  | Bismuth | 4.0–4.5 |
|  | Polonium | 4.5–5.0 |

From the foregoing listing of available metals having a work function of 4 eV or greater attractive higher work function metals for the most part are accounted for by aluminum, the Group Ib metals (copper, silver, and gold), the metals in Groups IV, V, and VI, and the Group VIII transition metals, particularly the noble metals from this group. Aluminum, copper, silver, gold, tin, lead, bismuth, tellurium, and antimony are particularly preferred higher work function second metals for incorporation in the cathode.

There are several reasons for not restricting the choice of the second metal based on either its work function or oxidative stability. The second metal is only a minor component of the cathode. One of its primary functions is to stabilize the first, low work function metal, and, surprisingly, it accomplishes this objective independent of its own work function and susceptibility to oxidation.

A second valuable function which the second metal performs is to reduce the sheet resistance of the cathode as a function of the thickness of the cathode. Since acceptably low sheet resistance levels (less than 100 ohms per square) can be realized at low cathode thicknesses (less than 250 Angstroms), cathodes can be formed which exhibit high levels of light transmission. This permits highly stable, thin, transparent cathodes of acceptably low resistance levels and high electron injecting efficiencies to be achieved for the first time. This in turn permits (but does not require) the organic EL devices of this invention to be constructed with light transmissive cathodes and frees the organic EL devices of any necessity of having a light transmissive anode to achieve light emission through an electrode area.

A third valuable function which the second metal has been observed to perform is to facilitate vacuum vapor deposition of a first metal onto the organic luminescent medium of the EL device. In vapor deposition less metal is deposited on the walls of the vacuum chamber and more metal is deposited on the organic luminescent medium when a second metal is also deposited. The efficacy of the second metal in stabilizing organic EL device, reducing the sheet resistance of thin cathodes, and in improving acceptance of the first metal by the organic luminescence medium is demonstrated by the examples below.

Only a very small proportion of a second metal need be present to achieve these advantages. Only about 0.1 percent of the total metal atoms of the cathode need be accounted for by the second metal to achieve a substantial improvement. Where the second metal is itself a low work function metal, both the first and second metals are low work function metals, and it is immaterial which is regarded as the first metal and which is regarded as the second metal. For example, the cathode composition can range from about 0.1 percent of the metal atoms of the cathode being accounted for by one low work function metal to about 0.1 percent of the total metal atoms being accounted for by a second low work function metal. Preferably one of the two metals accounts for at least 1 percent and optimally at least 2 percent of the total metal atoms present.

When the second metal is a relatively higher (at least 4.0 eV) work function metal, the low work function metal preferably accounts for greater than 50 percent of the total metal atoms of the cathode. This is to avoid reduction in electron injection efficiency by the cathode, but it is also predicated on the observation that the benefits of adding a second metal are essentially realized when the second metal accounts for less than 20 percent of the total metal atoms of the cathode.

Although the foregoing discussion has been in terms of a binary combination of metals forming the cathode, it is, of course, appreciated that combinations of three, four, or even higher numbers of metals are possible and can be employed, if desired. The proportions of the first metal noted above can be accounted for by any convenient combination of low work function metals and the proportions of the second metal can be accounted for any combination of high and/or low work function metals.

While the second metal or metals can be relied upon to enhance electrical conductivity, their minor proportion of the total cathode metal renders it unnecessary that these metals be present in an electrically conducting form. The second metal or metals can be present as compounds (e.g., lead, tin, or antimony telluride) or in an oxidized form, such as in the form of one or more metal oxides or salts. Since the first, low work function metal or metals account for the major proportion of the cathode metal content and are relied upon for electron conduction, they are preferably employed in their elemental form, although some oxidation may occur on aging.

Figure 4:
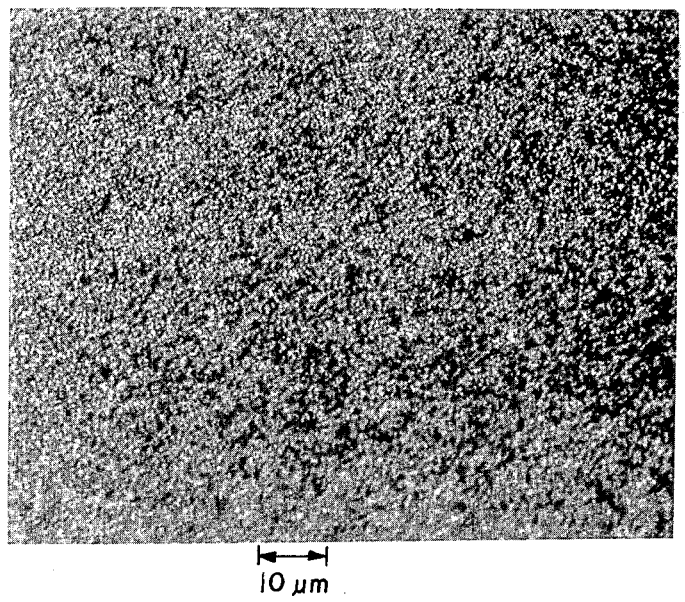
FIGS. 4 and 5 are micrographs of conventional and inventive cathodes, respectively.
Figure 5:
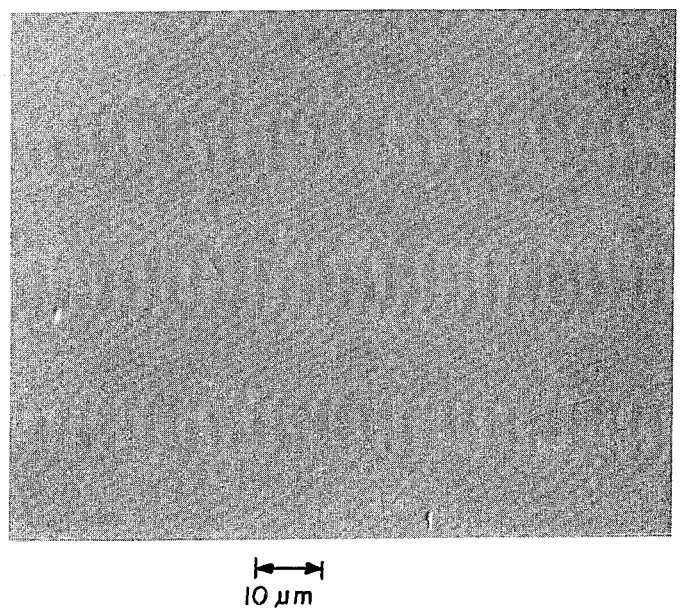

The manner in which the presence of a second metal physically intervenes to enhance cathode stability and light transmission enhancement while reducing sheet resistance can be appreciated by comparing FIGS. 4 and 5. FIG. 4 is a micrograph, enlarged to the scale indicated, of a vacuum vapor deposited conventional, prior art cathode consisting of magnesium. The thickness of the magnesium coating is 2000 Angstroms. The non-uniformity of the coating, detracting both from its electrical conductivity and its ability to transmit light, is readily apparent. Because of its non-uniformity the coating is also more readily penetrable and therefore more susceptible to oxidative degradation.

In direct contrast, the cathode of FIG. 5 illustrating the invention, also 2000 Angstroms in thickness, is smooth and featureless. This cathode is formed by the vacuum vapor deposition of magnesium and silver, with the magnesium and silver being present in an atomic ratio of 10:1. That is, the silver atoms are present in a concentration of 9 percent of total metal atoms present. The imperceptibly low granularity of the invention cathode is indicative of a higher and more uniform coverage of the deposition substrate. Identical substrates were employed in forming the FIGS. 4 and 5 coatings.

In depositing the first metal alone onto a substrate or onto the organic luminescent medium, whether from solution or, preferably, from the vapor phase, initial, spatially separated deposits of the first metal form nuclei for subsequent deposition. Subsequent deposition leads to the growth of these nuclei into microcrystals. The result is an uneven and random distribution of microcrystals, leading to a non-uniform cathode. By presenting a second metal during at least one of the nucleation and growth stages and, preferably, both, the high degree of symmetry which a single element affords is reduced. Since no two substances form crystal cells of exactly the same habit and size, any second metal reduces the degree of symmetry and at least to some extent acts to retard microcrystal growth. Where the first and second metals have distinctive crystal habits, spatial symmetry is further reduced and microcrystal growth is further retarded. Retarding microcrystal growth favors the formation of additional nucleation sites. In this way the number of deposition sites is increased and a more uniform coating is achieved.

Depending upon the specific choice of metals, the second metal, where more compatible with the substrate, can produce a disproportionate number of the nucleation sites, with the first metal then depositing at these nucleation sites. Such a mechanism may, if fact, account for the observation that, with a second metal present, the efficiency with which the first metal is accepted by a substrate is significantly enhanced. It has been observed, for example, that less deposition of the first metal occurs on vacuum chamber walls when a second metal is being co-deposited.

The first and second metals of the cathode are intimately intermingled, being co-deposited. That is, the deposition of neither the first nor second metals is completed before at least a portion of the remaining metal is deposited. Simultaneous deposition of the first and second metals is generally preferred. Alternatively, successive incremental depositions of the first and second metals can be undertaken, which at their limit may approximate concurrent deposition.

While not required, the cathode, once formed can be given post treatments. For example, the cathode may be heated within the stability limits of the substrate in a reducing atmosphere. Other action on the cathode can be undertaken as a conventionally attendant feature of lead bonding or device encapsulation.

The organic luminescent medium of the EL devices of this invention preferably contains at least two separate organic layers, at least one layer forming a zone for transporting electrons injected from the cathode and at least one layer forming a zone for transporting holes injected from the anode. As is more specifically taught by Van Slyke et al U.S. Ser. No. 13,528, concurrently filed and commonly assigned, titled ELECTROLUMINESCENT DEVICE WITH ORGANIC LUMINESCENT MEDIUM, cited above, the latter zone is in turn preferably formed of at least two layers, one, located in contact with the anode, providing a hole injecting zone and the remaining layer, interposed between the layer forming the hole injecting zone and the layer providing the electron transporting zone, providing a hole transporting zone. While the description which follows is directed to the preferred embodiments of organic EL devices according to this invention which employ at least three separate organic layers, as taught by Van Slyke et al, it is appreciated that either the layer forming the hole injecting zone or the layer forming the hole transporting zone can be omitted and the remaining layer will perform both functions. Higher initial and sustained performance levels of the organic EL devices of this invention are realized when the separate hole injecting and hole transporting layers described below are employed in combination.

A layer containing a porphyrinic compound forms the hole injecting zone of the organic EL device. A porphyrinic compound is any compound, natural or synthetic, which is derived from or includes the porphyrin structure. Any of the porphyrinic compounds disclosed by Adler U.S. Pat. No. 3,935,031 or Tang U.S. Pat. No. 4,356,429, the disclosures of which are here incorporated by reference, can be employed.

Preferred porphyrinic compounds are those of structural formula (I):

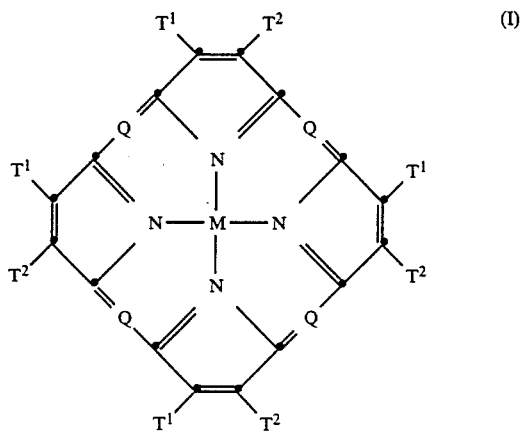

wherein
Q is —N= or —C(R)=;
M is a metal, metal oxide, or metal halide;
R is hydrogen, alkyl, aralkyl, aryl, or alkaryl, and
$T^1$ and $T^2$ represent hydrogen or together complete a unsaturated 6 membered ring, which can include substituents, such as alkyl or halogen. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogen for the metal atom, as indicated by formula (II):

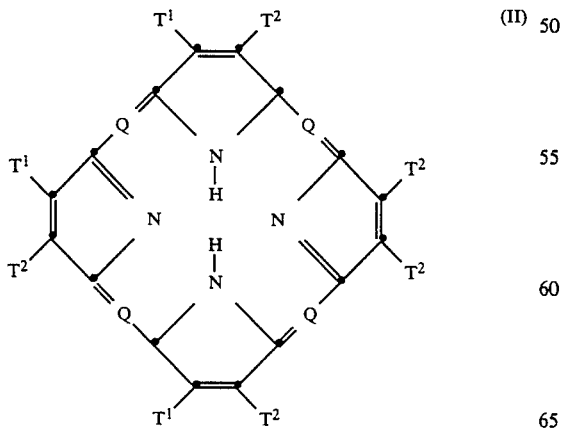

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:
PC-1 Porphine
PC-2 1,10,15,20-Tetraphenyl-21H,23H-porphine copper (II)
PC-3 1,10,15,20-Tetraphenyl-21H,23H-porphine zinc (II)
PC-4 5,10,15,20-Tetrakis(pentafluorophenyl)-21H,23H-porphine
PC-5 Silicon phthalocyanine oxide
PC-6 Aluminum phthalocyanine chloride
PC-7 Phthalocyanine (metal free)
PC-8 Dilithium phthalocyanine
PC-9 Copper tetramethylphthalocyanine
PC-10 Copper phthalocyanine
PC-11 Chromium phthalocyanine fluoride
PC-12 Zinc phthalocyanine
PC-13 Lead phthalocyanine
PC-14 Titanium phthalocyanine oxide
PC-15 Magnesium phthalocyanine
PC-16 Copper octamethylphthalocyanine The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (III):

wherein
$Q^1$ and $Q^2$ are independently aromatic tertiary amine moieties and
G is a linking group such an arylene, cycloalkylene, or alkylene group or a carbon to carbon bond.

A particularly preferred class of triarylamines satisfying structural formula (III) and containing two triarylamine moieties are those satisfying structural formula (IV):

where

R[1] and R[2] each independently represents a hydrogen atom, an aryl group or alkyl group or R[1] and R[2] together represent the atoms completing a cycloalkyl group and R[3] and R[4] each independently represents an aryl group which is in turn substituted with a diaryl substituted amino group, as indicated by structural formula (V):

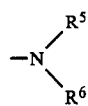

(V)

wherein R[5] and R[6] are independently selected aryl groups.

Another preferred class of aromatic tertiary amines are tetraaryldiamines. Preferred tetraaryldiamines include two diarylamino groups, such as indicated by formula (V), linked through an arylene group. Preferred tetraaryldiamines include those represented by formula (VI).

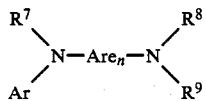

(VI)

wherein
Are is an arylene group,
n is an integer of from 1 to 4, and
Ar, R[7], R[8], and R[9] are independently selected aryl groups.

The various alkyl, alkylene, aryl, and arylene moieties of the foregoing structural formulae (III), (IV), (V), and (VI) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 5 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

While the entire hole transporting layer of the organic electroluminesce medium can be formed of a single aromatic tertiary amine, it is a further recognition of this invention that increased stability can be realized by employing a combination of aromatic tertiary amines. Specifically, as demonstrated in the examples below, it has been observed that employing a triarylamine, such as a triarylamine satisfying formula (IV), in combination with a tetraaryldiamine, such as indicated by formula (VI), can be advantageous. When a triarylamine is employed in combination with a tetraaryldiamine, the latter is positioned as a layer interposed between the triarylamine and the electron injecting and transporting layer.

Representative useful aromatic tertiary amines are disclosed by Berwick et al U.S. Pat. No. 4,175,960 and Van Slyke et al U.S. Pat. No. 4,539,507, here incorporated by reference. Berwick et al in addition discloses as useful hole transporting compounds N substituted carbazoles, which can be viewed as ring bridged variants of the diaryl and triarylamines disclosed above.

Illustrative of useful aromatic tertiary amines are the following:
ATA-1 1,1-Bis(4-di-p-tolylaminophenyl)cyclohexane
ATA-2 1,1-Bis(4-di-p-tolylaminophenyl)-4-phenylcyclohexane
ATA-3 4,4'-Bis(diphenylamino)quadriphenyl
ATA-4 Bis(4-dimethylamino-2-methylphenyl)-phenylmethane
ATA-5 N,N,N-Tri(p-tolyl)amine
ATA-6 4-(di-p-tolylamino)-4'-[4(di-p-tolylamino)-styryl]stilbene
ATA-7 N,N,N',N'-Tetra-p-tolyl-4,4'-diaminobiphenyl
ATA-8 N,N,N',N'-Tetraphenyl-4,4'-diaminobiphenyl
ATA-9 N-Phenylcarbazole
ATA-10 Poly(N-vinylcarbazole)

Any conventional electron injecting and transporting compound or compounds can be employed in forming the layer of the organic luminescent medium adjacent the cathode. This layer can be formed by historically taught luminescent materials, such as anthracene, naphthalene, phenanthrene, pyrene, chrysene, and perylene and other fused ring luminescent materials containing up to about 8 fused rings as illustrated by Gurnee et al U.S. Pat. No. 3,172,862, Gurnee U.S. Pat. No. 3,173,050, Dresner, "Double Injection Electroluminescence in Anthracene", RCA Review, Vol. 30, pp. 322–334, 1969; and Dresner U.S. Pat. No. 3,710,167, cited above. Although such fused ring luminescent materials do not lend themselves to forming thin (<1 μm) films and therefore do not lend themselves to achieving the highest attainable EL device performance levels, organic EL devices incorporating such luminescent materials when constructed according to the invention show improvements in performance and stability over otherwise comparable prior art EL devices.

Among electron transporting compounds useful in forming thin films are the butadienes, such as 1,4-diphenylbutadiene and tetraphenylbutadiene; coumarins; and stilbenes, such as trans-stilbene, disclosed by Tang U.S. Pat. No. 4,356,429, cited above.

Still other thin film forming electron transporting compounds which can be used to form the layer adjacent the cathode are optical brighteners, particularly those disclosed by Van Slyke et al U.S. Pat. No. 4,539,507, cited above and here incorporated by reference. Useful optical brighteners include those satisfying structural formulae (VII) and (VIII):

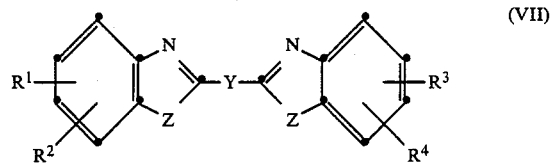

(VII)

or

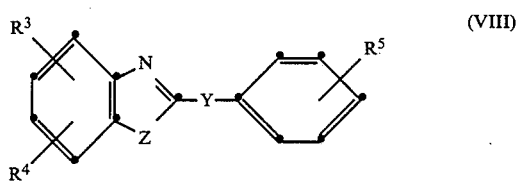

(VIII)

wherein
R[1], R[2], R[3], and R[4] are individually hydrogen; saturated aliphatic of from 1 to 10 carbon atoms, for example, propyl, t-butyl, heptyl, and the like; aryl of from 6 to 10 carbon atoms, for example, phenyl and naphthyl; or halo such as chloro, fluoro, and the like; or $R^1$ and $R^2$ or $R^3$ and $R^4$ taken together comprise the atoms necessary to complete a fused aromatic ring optionally bearing at least one saturated aliphatic of from 1 to 10 carbon atoms, such as methyl, ethyl, propyl and the like;

$R^5$ is a saturated aliphatic of from 1 to 20 carbon atoms, such as methyl, ethyl, n-eicosyl, and the like; aryl of from 6 to 10 carbon atoms, for example, phenyl and naphthyl; carboxyl; hydrogen; cyano; or halo, for example, chloro, fluoro and the like; provided that in formula (VII) at least two of $R^3$, $R^4$ and $R^5$ are saturated aliphatic of from 3 to 10 carbon atoms, e.g., propyl, butyl, heptyl and the like;

Z is —O—, —NH—, or —S—; and
Y is

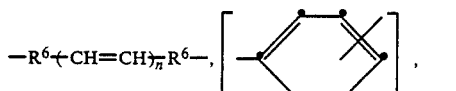

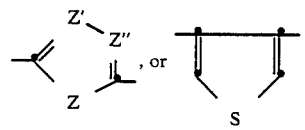

wherein
m is an integer of from 0 to 4;
n is arylene of from 6 to 10 carbon atoms, for example, phenylene and naphthylene; and
Z' and Z" are individually N or CH.

As used herein "aliphatic" includes substituted aliphatic as well as unsubstituted aliphatic. The substituents in the case of substituted aliphatic include alkyl of from 1 to 5 carbon atoms, for example, methyl, ethyl, propyl and the like; aryl of from 6 to 10 carbon atoms, for example, phenyl and naphthyl; halo, such as chloro, fluoro and the like; nitro; and alkoxy having 1 to 5 carbon atoms, for example, methoxy, ethoxy, propoxy, and the like.

Still other optical brighteners that are contemplated to be useful are listed in Vol. 5 of *Chemistry of Synthetic Dyes*, 1971, pages 618–637 and 640. Those that are not already thin-film-forming can be rendered so by attaching an aliphatic moiety to one or both end rings.

Particularly preferred for use in forming the electron injecting and transporting layers of the organic EL devices of this inventions are metal chelated oxinoid compounds, including chelates of oxine (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (IX):

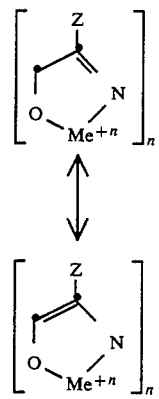

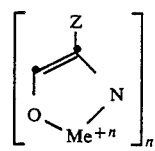

wherein
Me represents a metal;
n is an integer of from 1 to 3; and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

CO-1 Aluminum trisoxine [a.k.a., tris(8-quinolinol) aluminum]
CO-2 Magnesium bisoxine [a.k.a., bis(8-quinolinol) magnesium]
CO-3 Bis[benzo{f}-8-quinolinol] zinc
CO-4 Bis(2-methyl-8-quinolinolato) aluminum oxide
CO-5 Indium trisoxine [a.k.a., tris(8-quinolinol) indium]
CO-6 Aluminum tris(5-methyloxine) [a.k.a., tris(5-methyl-8-quinolinol) aluminum
CO-7 Lithium oxine (a.k.a., 8-quinolinol lithium]
CO-8 Gallium tris(5-chlorooxine) [a.k.a, tris(5-chloro-8-quinolinol) gallium]
CO-9 Calcium bis(5-chlorooxine) [a.k.a, bis(5-chloro-8-quinolinol) calcium]
CO-10 Poly[zinc (II)-bis(8-hydroxy5-quinolinyl)methane]
CO-11 Dilithium epindolidione In the organic EL devices of the invention it is possible to maintain a current density compatible with efficient light emission while employing a relatively low voltage across the electrodes by limiting the total thickness of the organic luminescent medium to less than 1 μm (10,000 Angstroms). At a thickness of less than 1 μm an applied voltage of 20 volts results in a field potential of greater than $2 \times 10^5$ volts/cm, which is compatible with efficient light emission. An order of magnitude reduction (to 0.1 μm or 1000 Angstroms) in thickness of the organic luminescent medium, allowing further reductions in applied voltage and/or increase in the field potential and hence current density, are well within device construction capabilities.

One function which the organic luminescent medium performs is to provide a dielectric barrier to prevent shorting of the electrodes on electrical biasing of the EL device. Even a single pin hole extending through the organic luminescent medium will allow shorting to occur. Unlike conventional EL devices employing a single highly crystalline luminescent material, such as anthracene, for example, the EL devices of this invention are capable of fabrication at very low overall organic luminescent medium thicknesses without shorting. One reason is that the presence of three superimposed layers greatly reduces the chances pin holes in the layers being aligned to provide a continuous conduction path between the electrodes. This in itself permits one or even two of the layers of the organic luminescent medium to be formed of materials which are not ideally suited for film formation on coating while still achieving acceptable EL device performance and reliability.

The preferred materials for forming the organic luminescent medium are each capable of fabrication in the form of a thin film—that is, capable of being fabricated as a continuous layer having a thickness of less than 0.5 $\mu$m or 5000 Angstroms.

When one or more of the layers of the organic luminescent medium are solvent coated, a film forming polymeric binder can be conveniently co-deposited with the active material to assure a continuous layer free of structural defects, such as pin holes. If employed, a binder must, of course, itself exhibit a high dielectric strength, preferably at least about $2 \times 10^6$ volt/cm. Suitable polymers can be chosen from a wide variety of known solvent cast addition and condensation polymers. Illustrative of suitable addition polymers are polymers and copolymers (including terpolymers) of styrene, t-butylstyrene, N-vinyl carbazole, vinyltoluene, methyl methacrylate, methyl acrylate, acrylonitrile, and vinyl acetate. Illustrative of suitable condensation polymers are polyesters, polycarbonates, polyimides, and polysulfones. To avoid unnecessary dilution of the active material binders are preferably limited to less than 50 percent by weight, based on the total weight of the material forming the layer.

The preferred active materials forming the organic luminescent medium are both film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited porphorinic compound as a hole injecting layer, a film forming aromatic tertiary amine as a hole transporting layer, and a chelated oxinoid compound as an electron injecting and transporting layer, thicknesses in the range of from about 50 to 5000 Angstroms are contemplated, with layer thicknesses in the range of from 100 to 2000 Angstroms being preferred. It is generally preferred that the overall thickness of the organic luminescent medium be at least about 1000 Angstroms.

The anode of the organic EL device can take any convenient conventional form. Where it is intended to transmit light from the organic EL device through the anode, this can be conveniently achieved by coating a thin conductive layer onto a light transmissive substrate—e.g., a transparent or substantially transparent glass plate or plastic film. In one form the organic EL devices of this invention can follow the historical practice of including a light transmissive anode formed of tin oxide or indium tin oxide coated on a glass plate, as disclosed by Gurnee et al U.S. Pat. No. 3,172,862, Gurnee U.S. Pat. No. 3,173,050, Dresner, "Double Injection Electroluminescence in Anthracene", *RCA Review*, Vol. 30, pp. 322-334, 1969; and Dresner U.S. Pat. No. 3,710,167, cited above. While any light transmissive polymeric film can be employed as a substrate, Gillson U.S. Pat. No. 2,733,367 and Swindells U.S. Pat. No. 2,941,104 disclose polymeric films specifically selected for this purpose.

As employed herein the term "light transmissive" means simply that the layer or element under discussion transmits greater than 50 percent of the light of at least one wavelength it receives and preferably over at least a 100 nm interval. Since both specular (unscattered) and diffused (scattered) emitted light are desirable device outputs, both translucent and transparent or substantially transparent materials are useful. In most instances the light transmissive layers or elements of the organic EL device are also colorless or of neutral optical density—that is, exhibiting no markedly higher absorption of light in one wavelength range as compared to another. However, it is, of course, recognized that the light transmissive electrode supports or separate superimposed films or elements can be tailored in their light absorption properties to act as emission trimming filters, if desired. Such an electrode construction is disclosed, for example, by Fleming U.S. Pat. No. 4,035,686. The light transmissive conductive layers of the electrodes, where fabricated of thicknesses approximating the wavelengths or multiples of the light wavelengths received can act as interference filters.

Contrary to historical practice, in one preferred form the organic EL devices of this invention emit light through the cathode rather than the anode. This relieves the anode of any requirement that it be light transmissive, and it is, in fact, preferably opaque to light in this form of the invention. Opaque anodes can be formed of any metal or combination of metals having a suitably high work function for anode construction. Preferred anode metals have a work function of greater than 4. Suitable anode metals can be chosen from among the high ($>4$) work function metals listed above. An opaque anode can be formed of an opaque metal layer on a support or as a separate metal foil or sheet.

EXAMPLES

The invention and its advantages are further illustrated by the specific examples which follow. The term "atomic percent" indicates the percentage of a particular metal present, based on the total number of metal atoms present. In other words, it is analogous to mole percent, but is based on atoms rather than molecules. The term "cell" as employed in the examples denotes an organic EL device.

EXAMPLE 1

Mg and Ag Cathode (a) A substrate of indium tin oxide (ITO) coated soda lime glass was polished using 0.05 $\mu$m alumina abrasive for a few minutes, followed by ultrasonic cleaning in a 1:1 (volume) mixture of isopropyl alcohol and distilled water. It was then rinsed with isopropyl alcohol and blown dry with nitrogen.

(b) The hole transporting layer, ATA-1, (~750Å) was deposited on the ITO substrate by vacuum deposition. The material was evaporated from a quartz boat heated by a tungsten filament.

(c) CO-1 (~750Å) was deposited on top of the ATA-1 layer. The material was evaporated from a quartz boat heated by a tungsten filament.

(d) A (Mg:Ag) electrode (~4000Å) was then deposited on top of the CO-1 film through a shadow mask of 0.1 cm² aperture which defined the active area of the electroluminescent cell. The Mg:Ag electrode was deposited using a two-source evaporation technique. Mg and Ag were co-evaporated from two separate sources. For Mg, a tantalum boat with perforated cover was used. For Ag an open tantalum boat was suitable. The rates of deposition, monitored independently by two thickness monitors, were adjusted to give the desired composition of Mg/Ag mixture film. A useful composition was about 10:1 (atomic ratio) of Mg:Ag.

(e) In electroluminescent operation, a positive voltage was applied to the ITO electrode and the (Mg:Ag) electrode was connected to ground via an ammeter. The light emitted by the cell was detected by a radiometer or photometer. The cell began to emit green light at an applied voltage of about 3 volts and reached the 0.05 mW/cm² level at about 5 volts. Since 1 mW/cm² is equal to 950 cd/m² for green light, it is apparent that the EL device emitted light was clearly visible in ambient room light. The power of the emitted light reached 13 mW/cm², at about 15 volts. Beyond this level the cell suffered irreversible breakdown. The power conversion efficiency at the light output of 0.05 mW/cm² was about $4.5 \times 10^{-3}$ W/W.

(f) For stability testing the cell was continuously operated in a dry argon ambient. The cell was driven by a constant current source providing 5 mA/cm² at about 7 volts. The initial light output was 0.13 mW/cm². The life to half brightness, i.e., the time taken for the light level to drop from 0.13 mW/cm² to 0.06 mW/cm², was about 140 hours.

EXAMPLE 2

In Cathode (a comparative example)

A glass/ITO/ATA-1/CO-1-Cathode-metal cell was prepared as described in Example 1, except that the cathode-metal was an evaporated indium film of about 5000 Å thickness. It began to emit green light at about 5 volts and reached 0.05 mW/cm² light level at about 7.5 volts requiring a current density of 6.5 mA/cm². The power conversion efficiency of this cell operating at 0.05 mW/cm² light output was $1 \times 10^{-3}$ W/W. This efficiency is about a factor of 5 lower compared with the efficiency of the EL cell of Example 1 using Mg:Ag electrode.

The indium electrode cell was tested for operational stability in a dry argon ambient as in Example 1. In order to achieve the same brightness level as the Mg:Ag electroded cell of Example 1, the cell was driven at a constant current of 20 mA/cm² which provided an initial brightness of 0.15 mW/cm². Under these conditions the brightness degraded rapidly. The life to half brightness was less than 1 hour. The brightness decreased by 80% in less than 10 hours.

EXAMPLE 3

Ag:Rare Earth Cathode

A glass/ITO/ATQ-1/CO-1/cathode cell was prepared as described in Example 1, except that the cathode was a mixed layer of Ag and Eu. The (Ag+Eu) cathode was prepared by co-evaporation from separate Ag and Eu sources. The weight ratio of the Ag to Eu was about 1:1 and the total thickness was about 2000 Å.

The cell required low voltage for EL operation. The cell began to emit green light at about 3 volts, and reached the 0.05 mW/cm² level at about 6.5 volts. The maximum light power attainable was about 10 mW/cm² before breakdown. The power conversion efficiency was about $4 \times 10^{-3}$ W/W at an output light level of 0.05 mW/cm².

The stability of this cell was comparable to that of the Mg:Ag cell of Example 1. The cell could operate above the 0.05 mW/cm² light level for more than 50 hours.

EXAMPLE 4

Eu cathode (a comparative example)

A glass/ITO/ATA-1/CO-1/cathode cell was prepared as described in Example 3, except that the cathode was pure Eu. The Eu layer was about 5000 Å thick and was prepared by vacuum deposition.

This Eu cathode was found to be very sensitive to oxygen and moisture. The cathode was rapidly tarnished when first removed from the vacuum evaporator. The EL cell made with this cathode was non-operational.

This example illustrates the need for the stabilizing effect of a mixed (Ag:Eu) cathode as described in Example 3.

EXAMPLE 5

Adhesion Enhancement

Vapor deposition of Mg on a chelated oxinoid thin film, such as CO-1, was greatly enhanced by co-deposition with Ag or other nucleating metals such as Cr, In, Ti, etc. It was found very difficult to deposit Mg alone on an organic thin film. Mg vapor atoms tended not to stick on the organic film, resulting in deposition of Mg on fixtures in the vacuum system rather than on the organic film. Using a co-deposition technique, even with a very small amount of nucleating metal, such as Ag, a smooth Mg:Ag film was deposited on the organic film which was useful in an EL cell and any deposition on system fixtures was reduced.

EXAMPLE 6

Stilbene Electron Injecting Layer

The (Mg:Ag) or (Eu:Ag) electron-injecting electrodes were useful in conjunction with many organic EL materials. In this example, the cell structure is glass-/ITO/ATA-1/S-1/(Mg:Ag) where S-1 is 4,4'-bis(5,7-di-t-pentyl-2-benzoxazolyl)stilbene. It was found that the use of a (Mg:Ag) electrode lowered the operating voltage required for a given level of light output of the EL cell when compared with a cell differing only by employing In as a cathode.

The driving voltage required for the (Mg:Ag) cell to produce a 0.05 mW/cm² light level is 7 volts as compared with 15 volts for the cell with the In cathode.

EXAMPLE 7

Other Useful Cathode Compositions

Mg:Cu, Mg:In, and Mg:Sn cathode compositions were used as cathodes in the glass/ITO/ATA-1 (750 Å)/CO-1 (750 Å)/cathode cell. In all instances, the cells required only a low voltage for operation. Typically the cells began to emit light at about 3 volts, and reached 0.05 mW/cm$^2$ light intensity at about 6-7 volts. These characteristics are similar to those observed with the cell employing a Mg:Ag electrode as described in Example 1.

EXAMPLE 8

Enhanced Conductivity and Optical Transmission

Onto a glass substrate CO-1 was vacuum vapor deposited as described in Example 1. Magnesium and silver were co-deposited onto the CO-1 layer as described in Example 1 in the atomic ratio of 10:1 at various thicknesses, as reported in Table I below, which correlates cathode thickness with resistivity and percentage of light transmission measured. Table II below compares resistivity and transmission when the sole difference is omission of silver during cathode deposition.

TABLE I (Example)
Glass substrate/CO-1 (750Å)/Mg:Ag (10:1)

| Thickness Å | Sheet Resistance ohms/square | Percent Transmission @ 550 nm |
|---|---|---|
| 50 | 1460 | 76 |
| 70 | 420 | 69 |
| 100 | 68 | 47 |
| 125 | 44 | 33 |
| 150 | 40 | 29 |
| 120 | 28 | 15 |

TABLE II (Comparison)
Glass substrate/CO-1 (750Å)/Mg

| Thickness Å | Sheet Resistance ohms/square | Percent Transmission @ 550 nm |
|---|---|---|
| 50 | >1 × 10$^7$ | 87 |
| 70 | >1 × 10$^7$ | 87 |
| 100 | >1 × 10$^7$ | 60 |
| 125 | >1 × 10$^7$ | 50 |
| 150 | 2.48 × 10$^3$ | 43 |
| 200 | 1.52 × 10$^2$ | 34 |

From comparison of the data in Tables I and II it is apparent that the presence of Ag markedly reduces resistivity without significantly decreasing the percentage of light transmitted at any given cathode layer thickness.

EXAMPLE 9

Varied Mg:Ag Ratios

An essentially similar procedure as reported in Example 8 was performed, except that in this instance a series of cathode coatings were formed of 140 Angstroms in thickness differing only in their proportions of Mg and Ag. Deposition was directly on glass, the CO-1 layer being omitted. The effect of varied ratios of Mg and Ag are summarized in Table III.

TABLE III

Glass substrate/Mg:Ag(140 Å)

| Sample | At. ratio Mg | At. ratio Ag | Sheet Resistance ohms/square | Percent Transmission @ 550 nm |
|---|---|---|---|---|
| 1 | 10 | 4 | 29.6 | 23 |
| 2 | 10 | 2 | 57.6 | 22 |
| 3 | 10 | 1 | 39.2 | 21 |
| 4 | 10 | 0.5 | 31.2 | 20 |
| 5 | 10 | 0.2 | 28.0 | 25 |
| 6 | 10 | 0 | >1 × 10$^7$ | 41 |

From Table III it is apparent that over the range of Mg:Ag atomic ratios of 10:4 to 0.2 the sheet resistance remained in the 30 to 60 ohms/square range while the percentage of light transmitted remained in the 20 to 25 percent range. However, with silver absent, the cathode layer became essentially non-conducting.

EXAMPLE 10

Visual Comparisons of Cathode Uniformity

Two EL cells of the following structure were prepared: Glass/ITO (375 A)/ATA-7 (375 A)/CO-1 (635 A)/Cathode. The cathodes were in both instances 2000 Angstroms in thickness.

In one EL cell the cathode was a control formed by the vacuum vapor deposition of Mg only. In the other EL cell the cathode was formed of a 10:1 atomic ratio of Mg:Ag. The optical micrographs (1000X magnification) reveals a granular structure for the Mg cathode (FIG. 4) as compared to a smooth and featureless structure for the Mg:Ag cathode (FIG. 5). The granular or island structure of the of Mg only deposit is believed to account for the poor conductivity of this metal alone at low thickness levels.

EXAMPLE 11

Efficiency Enhancements

This example illustrates that efficient electron injecting electrodes (cathodes) can be prepared using Mg as the low work function component and a variety of other elements as the stabilizing component. The electroluminescent cells have the following configuration:

Glass/ITO/PC-10(375Å)/
ATA-7(375Å)/CO-1(625Å)/Cathode(2000Å)

The cathode compositions are listed in Table IV along with the efficiency of the electroluminescent cells. The efficiency of cells with the alloyed cathode is about 0.0025 watt/watt, which is similar to the best achievable cell with a pure Mg cathode. This efficiency is relatively independent of the choice of the stabilizing components ranging from noble metal Ag to semimetal Te. The driving voltages of these cells are generally in the range of 5 to 10 volts. Cathodes without the Mg component are inefficient electron injecting contacts, providing electroluminescent cells of very low efficiencies as shown in Table IV. They also require higher driving voltage, typically above 20 volts (except In, which requires about 10 to 15 volts).

TABLE IV

EL Efficiency enhancements by Binary Cathode Compositions

| Sample | Cathode Mg:X | Composition Atomic %+ | Efficiency watt/watt |
|---|---|---|---|
| 1 | Mg:Ag | 8.7 | 2.5 × 10$^{-3}$ |

TABLE IV-continued

EL Efficiency enhancements by Binary Cathode Compositions

| Sample | Cathode Mg:X | Composition Atomic %[+] | Efficiency watt/watt |
|---|---|---|---|
| 2 | Mg:In | 11.5 | $1.8 \times 10^{-3}$ |
| 3 | Mg:Sn | 8.2 | $2.5 \times 10^{-3}$ |
| 4 | Mg:Sb | 7.2 | $2.9 \times 10^{-3}$ |
| 5 | Mg:Te | 9.6 | $2.7 \times 10^{-3}$ |
| 6 | Mg:Mn | 11.5 | $2.3 \times 10^{-3}$ |
| 7 | :Ag | 100 | $6.0 \times 10^{-5}$ |
| 8 | :In | 100 | $7.0 \times 10^{-4}$ |
| 9 | :Sn | 100 | $5.0 \times 10^{-5}$ |
| 10 | :Mn | 100 | 0 |
| 11 | :Mg | 100 | $0-2 \times 10^{-3}$[++] |

[+]Atomic % of X in cathode
[++]Reflects variances observed in preparing several deposits

EXAMPLE 12

Stability Enhancements

This example illustrates the extreme ambient instability of the pure Mg electrode and the relatively good stability of the electroluminescent cells having alloyed cathodes. The electroluminescent cells have the following configuration:

Glass/ITO/PC-10(375Å)/
ATA-7(375Å)/CO-1(625Å)/Mg:Ag(2000Å)

The composition of the Mg:Ag cathodes, ranged from 0 to 100 atomic % Ag, is listed in Table V together with the electroluminescent efficiencies at different time intervals after the cells were prepared. Note that the initial efficiency of cells with pure Mg cathode varied from 0 (non-functional cell) to a high efficiency of 0.002 watt/watt. Such a variation appears to depend on the condition of the vapor deposition. In general, a faster rate of Mg deposition (>100Å/sec) and a lower chamber pressure (<$10^{-6}$ torr) during deposition result in more efficient electroluminescent cells. In contrast, the use of Mg:Ag alloyed electrodes (up to 50 atomic % Ag) allows efficient electroluminescent cells to be reproducibly prepared under various deposition conditions with deposition rates ranging from 5 to 100 Å/s and chamber pressure from $10^{-6}$ to $10^{-4}$ torr. The alloyed Mg:Ag film is always smooth and featureless, as shown in FIG. 5, as long as Ag is present in more than 0.1 atomic %.

The usefulness of Mg:Ag cathodes is clearly reflected in their ambient stability compared with the pure Mg cathodes. Regardless of the initial efficiencies, cells with pure Mg cathode suffer from ambient instability, presumably due to the fast corrosion of the Mg cathode. In an ambience with a relative humidity of 20% or higher, the electroluminescent efficiency may drop by more than an order of magnitude in a matter of a few hours due to the excessive development of dark or non-emissive spots in the cell. In contrast, cells having Mg:Ag cathode with Ag present in about 1 atomic % or more but below 50% (a preferred range) can retain their initial efficiencies for over 200 hours under similar ambience. Table V lists the results of the ambient test for a series of cells with different cathode compositions. The variation of efficiencies as a function of time is probably due to the development of dark spots to a various degree.

TABLE V

Ambient Stability vs. Mg:Ag Cathode Content

| Sample | Atomic % Ag | Efficiency watt/watt | | |
|---|---|---|---|---|
| | | Initial | 45 hours | 220 Hours |
| 1 | 0 | 0-0.002[+] | $<1.0 \times 10^{-4}$ | 0 |
| 2 | 2 | $2.2 \times 10^{-3}$ | $2.8 \times 10^{-3}$ | $2.1 \times 10^{-3}$ |
| 3 | 5 | $2.4 \times 10^{-3}$ | $2.9 \times 10^{-3}$ | $1.8 \times 10^{-3}$ |
| 4 | 10 | $2.5 \times 10^{-3}$ | $2.9 \times 10^{-3}$ | $2.3 \times 10^{-3}$ |
| 5 | 33 | $1.0 \times 10^{-3}$ | $1.0 \times 10^{-3}$ | $1.3 \times 10^{-3}$ |
| 6 | 50 | $1.3 \times 10^{-3}$ | $2.0 \times 10^{-3}$ | $1.6 \times 10^{-3}$ |
| 7 | 83 | $6.0 \times 10^{-4}$ | $3.0 \times 10^{-5}$ | $1.0 \times 10^{-5}$ |
| 8 | 100 | $2.0 \times 10^{-4}$ | $<1 \times 10^{-5}$ | $<1 \times 10^{-5}$ |

[+]Reflects variances observed in preparing several deposits

The invention has been described in detail with particular reference to preferred embodiments thereof, but it will be understood that variations and modifications can be effected within the spirit and scope of the invention.

What is claimed is:

1. An electroluminescent device comprising in sequence, an anode, an organic hole transporting zone, an organic electron transporting zone, and a cathode, characterized in that
said cathode is comprised of a layer having a sheet resistance of less than 100 ohms per square consisting essentially of at least 50 percent magnesium and at least 0.1 percent of a metal having a work function greater than 4 eV, said metal percentages being based on total metal atoms present in said cathode layer.

2. An electroluminescent device according to claim 1 in which said organic hole transporting zone and said organic electron transporting zone together form an organic luminescent medium having a thickness of less than 1 micrometer.

3. An electroluminescent device according to claim 1 in which said organic electron transporting zone is formed of a stilbene or chelated oxinoid compound.

4. An electroluminescent device according to claim 3 in which said electron transporting zone is comprised of a vacuum vapor deposited stilbene or chelated oxinoid layer and said cathode layer is comprised of a mixture of magnesium and said high work function metal vacuum deposited on said electron transporting layer.

5. An electroluminescent device according to claim 1 in which said metal having a work function greater than 4 eV is present in said cathode layer in a concentration of from 1 to 20 percent of the total metal atoms present.

6. An electroluminescent device according to claim 1 in which said metal having a work function greater than 4 eV is a silver.

7. An electroluminescent device according to claim 1 in which said metal having a work function greater than 4 eV is aluminum.

8. An electroluminescent device according to claim 1 in which said metal having a work function greater than 4 eV is manganese.

9. An electroluminescent device according to claim 1 in which said metal having a work function greater than 4 eV is indium.

10. An electroluminescent device according to claim 1 in which said metal having a work function greater than 4 eV is tin.

11. An electroluminescent device according to claim 1 in which said metal having a work function greater than 4 eV is a copper.

12. An electroluminescent device according to claim 1 in which said metal having a work function greater than 4 eV is a gold.

13. An electroluminescent device according to claim 1 in which said metal having a work function greater than 4 eV is a Group VIII metal.

14. An electroluminescent device according to claim 13 in which said Group VIII metal is nickel.

15. An electroluminescent device according to claim 13 in which said Group VIII metal is a noble Group VIII metal.

16. An electroluminescent device according to claim 15 in which said noble Group VIII metal is palladium.

17. An electroluminescent device according to claim 1 in which said metal having a work function greater than 4 eV is chromium.

18. An electroluminescent device according to claim 1 in which said metal having a work function greater than 4 eV is antimony.

19. An electroluminescent device according to claim 1 in which said metal having a work function greater than 4 eV is tellurium.

20. An electroluminescent device comprising in sequence, an opaque anode comprised of a metal having a work function greater than 4 eV,
an organic luminescent medium consisting of
an organic hole transporting zone and
a chelated oxinoid electron transporting zone, and
a light transmissive cathode consisting essentially of a vacuum vapor deposited layer having a thickness of from 50 to 250 Angstroms and a sheet resistance of less than 100 ohms per square consisting essentially of magnesium and silver,
said silver being present in a concentration of from 0.1 to 50 percent, based on total magnesium and silver atoms present.

21. An electroluminescent device according to claim 20 in which said silver is present in said cathode layer in a concentration of from 1 to 20 percent of the total metal atoms present.

22. An electroluminescent device according to claim 20 in which said organic luminescent medium has a thickness of less than 1 micrometer.

23. An electroluminescent device according to claim 20 in which said chelated oxinoid compound is aluminum trisoxine.

* * * * *